(12) United States Patent
Tsai

(10) Patent No.: US 9,165,794 B1
(45) Date of Patent: Oct. 20, 2015

(54) PARTIAL GLOB-TOP ENCAPSULATION TECHNIQUE

(71) Applicant: Himax Display, Inc., Tainan (TW)

(72) Inventor: Jia-Lung Tsai, Tainan (TW)

(73) Assignee: Himax Display, Inc., Tainan (TW)

( * ) Notice: Subject to any disclaimer, the term of this patent is extended or adjusted under 35 U.S.C. 154(b) by 0 days.

(21) Appl. No.: 14/447,648

(22) Filed: Jul. 31, 2014

(51) Int. Cl.
*H01L 21/56* (2006.01)
*H01L 23/31* (2006.01)
*H01L 23/00* (2006.01)

(52) U.S. Cl.
CPC .............. *H01L 21/56* (2013.01); *H01L 23/3192* (2013.01); *H01L 24/49* (2013.01)

(58) Field of Classification Search
CPC ........... H01L 2224/73265; H01L 2224/48227; H01L 2224/48247; H01L 2224/2919; H01L 21/56; H01L 2924/0665
See application file for complete search history.

(56) References Cited

U.S. PATENT DOCUMENTS

| 5,866,953 A * | 2/1999 | Akram et al. ................. 257/790 |
| 8,969,120 B2 * | 3/2015 | Huang et al. .................... 438/64 |

* cited by examiner

*Primary Examiner* — Roy Potter
*Assistant Examiner* — Paul Patton
(74) *Attorney, Agent, or Firm* — Winston Hsu; Scott Margo

(57) ABSTRACT

A electronic device includes: a circuit board; a semiconductor device, disposed on the circuit board; a cover material, disposed above the semiconductor device; a plurality of bonding wires, respectively connected between a plurality of first contact pads of the semiconductor device and a plurality of second contact pads of the circuit board; a first encapsulant, formed by a first material, arranged to encapsulate a plurality of second bonds formed by electrically connecting the bonding wires to the second contact pads; and a second encapsulant, formed by a second material that is different from the first material, arranged to encapsulate a plurality of first bonds formed by electrically connecting the bonding wires to the first contact pads.

21 Claims, 4 Drawing Sheets

PARTIAL GLOB-TOP ENCAPSULATION TECHNIQUE

BACKGROUND OF THE INVENTION

1. Field of the Invention

The present invention relates generally to electronic packing technology, and more particularly, to a partial glob-top encapsulation technique using different encapsulants for encapsulating wire bonds of an electronic device, and a method thereof.

2. Description of the Prior Art

A so-called glob-top encapsulation is a conformal coating electronic packing technology, which can be used to protect bare die and wire bonds in a chip-on-board (COB) assembly. In the COB assembly technology, a bare die is directly mounted on a circuit board using epoxies for attaching, and the bare die is electrically connected to contact pads on the circuit board using wire bonding technology. The glob-top encapsulation technology forms an encapsulant by curing an adhesive material (e.g., epoxy or silicone) applied to the bare die, metal wires, and bonds, thereby providing a shell to protect them from stress related failures, contaminants, thermal shocks, and moisture.

In some optics-related application, such as a Liquid Crystal on Silicon (LCoS) device, there is a cover glass disposed above a bare die (or a silicon backplane). An encapsulant only covers some area of the die, but does not cover the whole cover glass, which is called partial glob-top encapsulation. In this technology, sometimes faces of the cover glass and the die are not aligned, which may form a notch around the corner of the die, thereby introducing a notch effect having a bad influence on fracture toughness of the encapsulant.

Please refer to FIG. 1, which illustrates a conventional partial glob-top encapsulation technology. Die 110 is electrically connected to a circuit board 120 through metal wires 130, and there is a cover glass 140 disposed above the die 110. Encapsulant 150 formed by curing an adhesive material covers the metal wires 130 and bonds 160. Generally, it is expected that the encapsulant 150 is rigid enough to resist external stresses. However, as a face 142 of the cover glass 140 is not aligned with a face 112 of the die 110, a notch 170 is therefore formed around the corner of the die 110. As a result, a notch effect is introduced. Such effect notch will cause the encapsulant 150 to become brittle because the stresses will concentrate at the notch 170, thereby causing fatigue cracks of the encapsulant 150. This effect will become stronger when the encapsulant 150 is more rigid.

A simplest solution to this issue is using a softer adhesive material. However, if the encapsulant 150 is formed by softer adhesive materials, the encapsulant 150 may become too weak to resist the external stresses such that the metal wires 130 and the bonds 160 may have poor endurance to physical damages. In view of this, there is a need to provide a different solution to address the above-mentioned issue.

SUMMARY OF THE INVENTION

With this in mind, it is one objective of the present invention to provide a hybrid encapsulation technique that uses different encapsulants to cover bonding wires and corresponding bonds at different sides of the bonding wires.

According to a first aspect, the present invention provides an electronic device, comprising: a circuit board; a semiconductor device, disposed on the circuit board; a cover material, disposed above the semiconductor device; a plurality of bonding wires, respectively connected between a plurality of first contact pads on the semiconductor device and a plurality of second contact pads on the circuit board; a first encapsulant, formed by a first material, arranged to encapsulate a section of each of the bonding wires and a plurality of second bonds that are formed by electrically connecting the bonding wires to the second contact pads; and a second encapsulant, formed by a second material that is different from the first material, arranged to encapsulate a plurality of first bonds that are formed by electrically connecting the bonding wires to the first contact pads.

According to a second aspect, the present invention provides a method of encapsulating an electronic device. The electronic device has: a circuit board; a semiconductor device disposed on and electrically connected to the circuit board via a plurality of bonding wires; and a cover material disposed above the semiconductor device. The method comprises: applying a first material to a plurality of second bonds on the circuit board circuit board and a section of each of bonding wires and curing the first material to form a first encapsulant, wherein the second bonds are connected to the bonding wires; and applying a second material to a plurality of first bonds on the semiconductor device and curing the second material to form a second encapsulant, wherein the first bonds are connected to the bonding wires.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
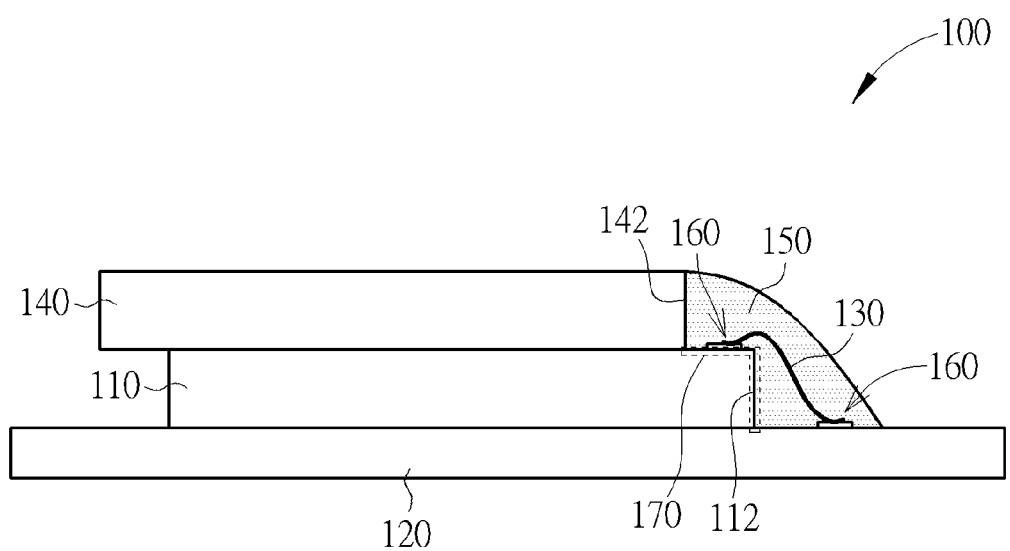
FIG. 1 illustrates a conventional partial glob-top encapsulation technology.
Figure 2:
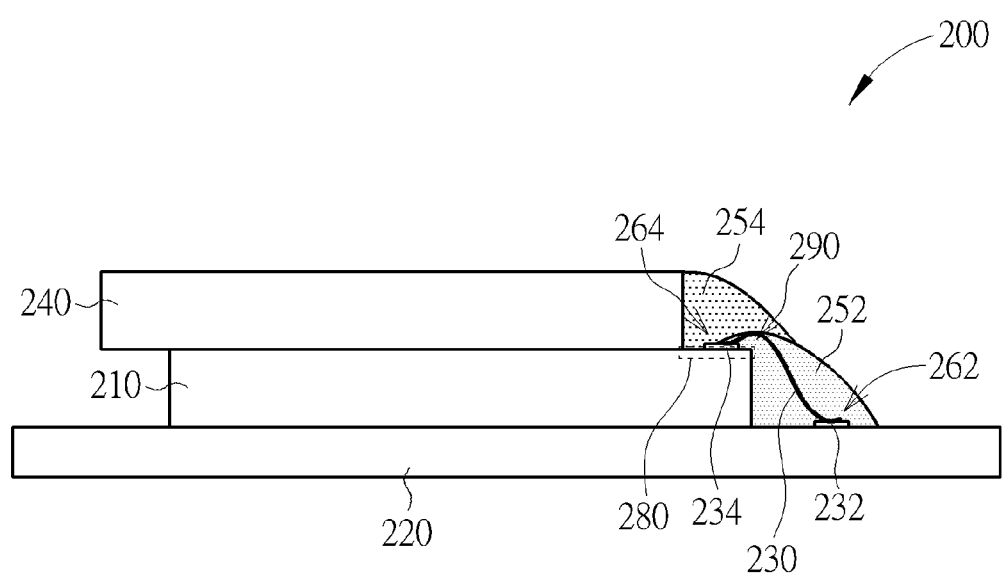
FIG. 2 illustrates an electronic device according to one exemplary embodiment of the present invention.

Please refer to FIG. 2, which illustrates an electronic device 200 according to one exemplary embodiment of the present invention. As shown by figure, a semiconductor device 210 is attached to a circuit board 220. In various embodiments, the circuit board 220 could be a printed circuit board or a flexible printed circuit. The semiconductor device 210 could be a bare die or a silicon backplane of an LCoS device, while the electronic device 200 could be an LCoS device or a COB assembly. A cover material 240 is disposed above the semiconductor device 210, which could be a cover glass.

There are a plurality of metal bonding wires (e.g. aluminum wires) 230 connected between the semiconductor device 210 and a circuit board 220. A plurality of first bonds 264 are formed by electrically connecting (e.g. soldering) first ends of the bonding wires 230 respectively to a plurality of contact pads 234 on the semiconductor device 210, and a plurality of second bonds 262 are formed by electrically connecting (e.g. soldering) second ends of the bonding wires 230 respectively to a plurality of contact pads 232 on the circuit board 220.

A first encapsulant 252 is formed by a first material that is different from a second material that a second encapsulant 254 is formed by. The first encapsulant 252 is more rigid than the second encapsulant 254. The first encapsulant 252 and the second encapsulant 254 respectively cover the second bonds 262 and the first bonds 264. The first encapsulant 252 further encapsulates most sections of each bonding wire 230, except that the second end of each bonding wire 230 close to the first bonds 264 are encapsulated by the second encapsulant 254.

As the first encapsulant 252 encapsulates most sections of each bonding wire 230, it is important to take coefficient of thermal expansion (CTE) matching into consideration due to heterogeneous materials joint. That is, CTE of the first encapsulant 252 must not be greater than CTE of the bonding wires 230; otherwise, internal stresses may be introduced to pull or push the bonding wires 230. For example, if the bonding wires 230 are aluminum wires and have the CTE of 24 ppm/K, the CTE of the first encapsulant 252 must not be greater than 24 ppm/K. In one embodiment, the CTE of the first encapsulant 252 is preferably between 5 ppm/K and 24 ppm/K.

The first encapsulant 252 is formed by an ultraviolet (UV) curing process applied to the first material. During the UV curing process, curing shrinkage of the first material may occur. In order to prevent curing shrinkage stresses on the bonding wires 230, the second bonds 262 or the semiconductor device 210, the curing shrinkage of the first material should not be greater than 0.3%.

In order to provide good protection to the second bonds 262 and the boding wires 230, the first encapsulant 252 must be enough rigid. Preferably, a shore hardness of the first encapsulant 252 is greater than 80D, thereby providing more endurance to physical damage or external stresses. Also, a glass transition temperature point of polymer is preferably greater than 85° C., to ensure the first encapsulant 252 has a lower CTE in most conditions.

The second encapsulant 254 only encapsulates second ends of the bonding wires 230, the first bonds 264 and covers an area 280 of the semiconductor device 210. A shore hardness of the second encapsulant 254 is smaller than the first encapsulant 252. Preferably, a shore hardness of the second encapsulant 254 is between 35D and 70D. The second encapsulant 254 mainly provides electric insulation as well as anti-moisture for the first bonds 264, second ends of the bonding wires 230, and the semiconductor device 210, while the first encapsulant 252 mainly protects and reinforces the bonding wires 230 and the second bonds 262.

Compared to the conventional art, the first encapsulant 252 has a smaller size than the encapsulant 150, and therefore the first encapsulant 252 has a smaller surface that external stresses can apply to. For example, the stress caused by the cover material 240 will not directly apply to the first encapsulant 252; however, in the case of a single encapsulant, it will. As a result, the first encapsulant 252 will not be easily cracked. Also, there will be fewer internal stresses in the first encapsulant 252 to wreck the bonding wires 230. As the corner of the semiconductor device 210 is covered by encapsulants having different rigidness instead of a single encapsulant, the notch affect is therefore eliminated. This is because the softer encapsulant can absorb some external stresses.

Figure 3:
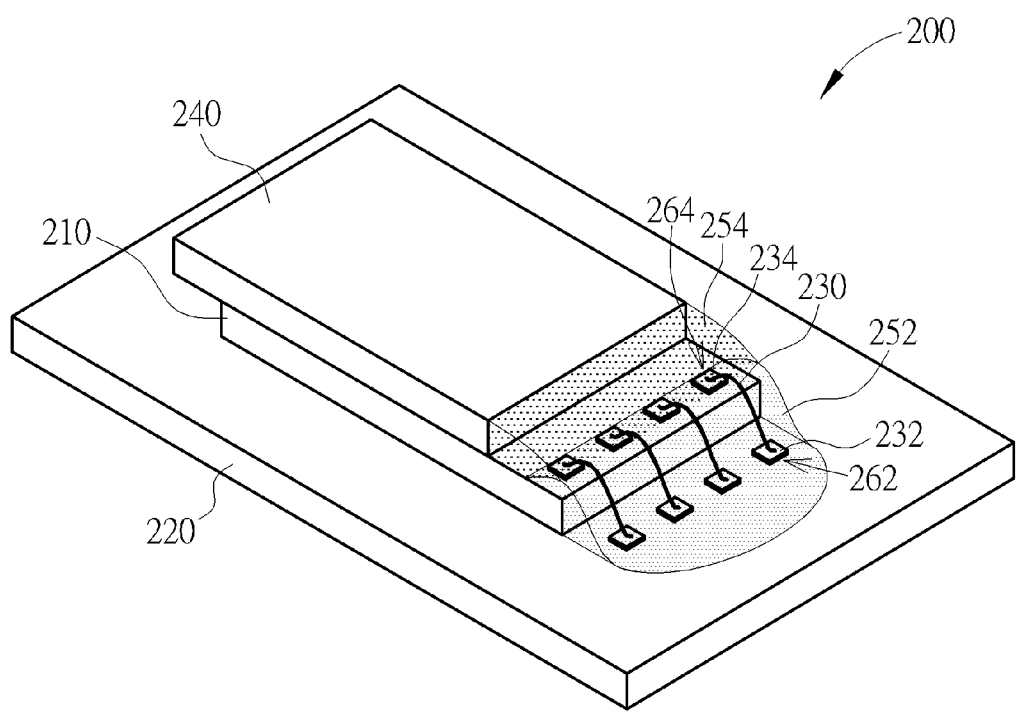
FIG. 3 illustrates an oblique drawing of the electronic device of FIG. 2.

FIG. 3 gives an oblique view of the electronic device of FIG. 2. As illustrated by the figure, the second encapsulant 254 not only covers first bonds 264 and second ends of the boding wires 230, but also extends between the semiconductor device 210 and the cover material 240. Similarly, the first encapsulant 252 not only covers the second bonds 262 and most sections of each boding wire 230, but also extends between the semiconductor device 210 and the circuit board 220.

Figure 4:
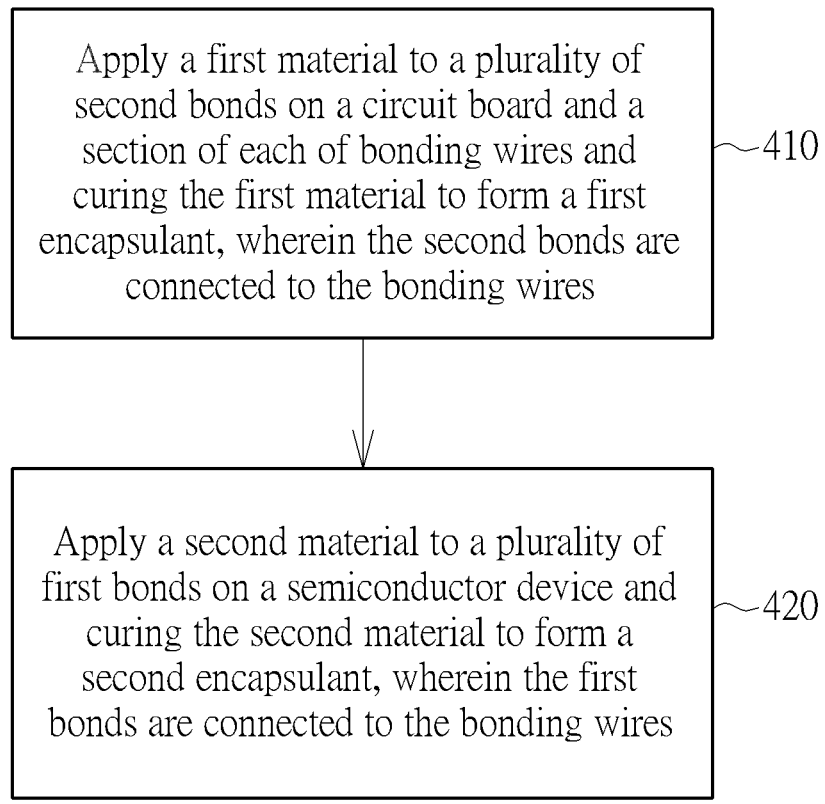
FIG. 4 illustrates a flowchart of a method of encapsulating an electronic according to one exemplary embodiment of the present invention.

FIG. 4 is a flowchart of a method of encapsulating an electronic device according to one exemplary embodiment of the present invention. The method can be employed for encapsulating the electronic device 200 as shown in FIG. 2 or any other electronic devices having similar structure. For ease of explanation, the method of the present invention will be explained using the electronic device 200 as an example. However, this is not intended for limiting the method of the present invention in scope.

At first, in step 410, a first material is applied to the second bonds 262 and the bonding wires 230. An UV curing process is applied to curing the first material to form a first encapsulant 252, thereby encapsulating second bonds 262 and the bonding wires 230. Specifically, the first material is originally applied around the second bonds 262 and the bonding wires 230. Due to capillary action, the first material will flow along with the bonding wires 230, to fulfill a space 290 that is below the bonding wires 230. And then, the first material is cured to form the first encapsulant 252.

In step 420, a second material is applied to the first bonds 264 and an area 280 of the semiconductor device 210 that is not covered by the first encapsulant 252. The UV curing process is further applied to the second material to form a second encapsulant 254 covering the first bonds 264, second ends of the bonding wires 230 and the area 280.

In conclusion, the hybrid encapsulation technique obtains higher reliability than single encapsulant due to the better environmental (thermal, moisture) and mechanical endurance. In addition, using a rigid encapsulant for bonds at one side of bonding wires and using a soft encapsulant for bonds at the other side of the bonding wires forms a reliable encapsulation without brittle fracture. The rigid encapsulant can protect bonding wires from physical damages, such as mechanical shock and thermal shock. Also the soft encapsulant can absorb some external stresses, thereby avoiding the notch effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
   a circuit board;
   a semiconductor device, disposed on the circuit board;
   a cover material, disposed above the semiconductor device;
   a plurality of bonding wires, respectively connected between a plurality of first contact pads on the semiconductor device and a plurality of second contact pads on the circuit board;
   a first encapsulant, formed by a first material, arranged to encapsulate a section of each of the bonding wires and a plurality of second bonds that are formed by electrically connecting the bonding wires to the second contact pads; and
   a second encapsulant, formed by a second material that is different from the first material, arranged to encapsulate a plurality of first bonds that are formed by electrically connecting the bonding wires to the first contact pads, and being in contact with the plurality of first bonds.

2. The electronic device of claim 1, wherein the first encapsulant is in contact with the second encapsulant.

3. The electronic device of claim 1, wherein a face of the cover material is in parallel with but not aligned with a face of the semiconductor device.

4. The electronic device of claim 1, wherein the first encapsulant cover a first face of the semiconductor device, while the second encapsulant cover a section of a second face of the semiconductor device.

5. The electronic device of claim 1, wherein the first encapsulant extends between the semiconductor device and the circuit board; and the second encapsulant extends between the semiconductor device and the cover material.

6. The electronic device of claim 1, wherein the cover material is a cover glass.

7. The electronic device of claim 1, wherein the circuit board is a printed circuit board or flexible printed circuit.

8. The electronic device of claim 1, wherein the semiconductor device is a silicon backplane of a liquid crystal on silicon (LCoS) device or a bare die.

9. The electronic device of claim 1, wherein a shore hardness of the first encapsulant is greater than that of the second encapsulant.

10. The electronic device of claim 1, wherein coefficient of thermal expansion (CTE) of the first encapsulant is not greater than that of the bonding wires.

11. The electronic device of claim 1, wherein coefficient of thermal expansion (CTE) of the first encapsulant is between 5 ppm/K and 24 ppm/K.

12. The electronic device of claim 1, wherein the first material has a glass transition temperature that is greater than 85° C.

13. The electronic device of claim 1, wherein curing shrinkage of the first material is not greater than 0.3%.

14. A method of encapsulating an electronic device, the electronic device having a circuit board, a semiconductor device disposed on and electrically connected to the circuit board via a plurality of bonding wires, a cover material disposed above the semiconductor device, the method comprising:
   applying a first material to a plurality of second bonds on the circuit board and a section of each of bonding wires and curing the first material to form a first encapsulant, wherein the second bonds are connected to the bonding wires; and
   applying a second material to a plurality of first bonds on the semiconductor device and curing the second material to form a second encapsulant, wherein the first bonds are connected to the bonding wires, and the second encapsulant is in contact with the plurality of first bonds.

15. The method of claim 14, wherein the first encapsulant is in contact with the second encapsulant.

16. The method of claim 14, wherein the first encapsulant extends between the semiconductor device and the circuit board; and the second encapsulant extends between the semiconductor device and the cover material.

17. The method of claim 14, wherein a shore hardness of the first encapsulant is greater than that of the second encapsulant.

18. The method of claim 14, wherein coefficient of thermal expansion (CTE) of the first encapsulant is not greater than that of the bonding wires.

19. The method of claim 14, wherein coefficient of thermal expansion (CTE) of the first encapsulant is between 5 ppm/K and 24 ppm/K.

20. The method of claim 14, wherein the first material has a glass transition temperature that is greater than 85° C.

21. The method of claim 14, wherein curing shrinkage of the first material is not greater than 0.3%.

* * * * *